United States Patent [19]
Jung

[11] Patent Number: 5,140,321
[45] Date of Patent: Aug. 18, 1992

[54] DATA COMPRESSION/DECOMPRESSION METHOD AND APPARATUS

[75] Inventor: Robert K. Jung, Norwood, Mass.

[73] Assignee: Prime Computer, Inc., Framingham, Mass.

[21] Appl. No.: 755,027

[22] Filed: Sep. 4, 1991

[51] Int. Cl.$^5$ ............................................. H03M 7/30
[52] U.S. Cl. .......................................... 341/55; 341/95
[58] Field of Search ..................... 341/55, 50, 106, 95

[56] References Cited

U.S. PATENT DOCUMENTS

| | | | |
|---|---|---|---|
| 4,597,057 | 6/1986 | Snow | 341/106 X |
| 5,049,881 | 9/1991 | Gibson et al. | 341/55 X |
| 5,051,745 | 9/1991 | Katz | 341/106 X |

*Primary Examiner*—Sharon D. Logan
*Attorney, Agent, or Firm*—Wolf, Greenfield & Sacks

[57] ABSTRACT

A method and apparatus for compressing digital data uses data which has been previously compressed as a dictionary of substrings which may be replaced in an input data stream. The method and apparatus uses a hash table to take advantage of principles of locality and probability to solve the maximal matching substring problem inherent in this type of compressing apparatus, most of the time. The hash table consists of first-in, first-out (FIFO) collision chains of fixed, uniform numbers of pointers to substrings of data already compressed which potentially match an input substring. A companion decompressing method and apparatus receives compressed data from the compressing apparatus and expand that data back to its original form.

14 Claims, 9 Drawing Sheets

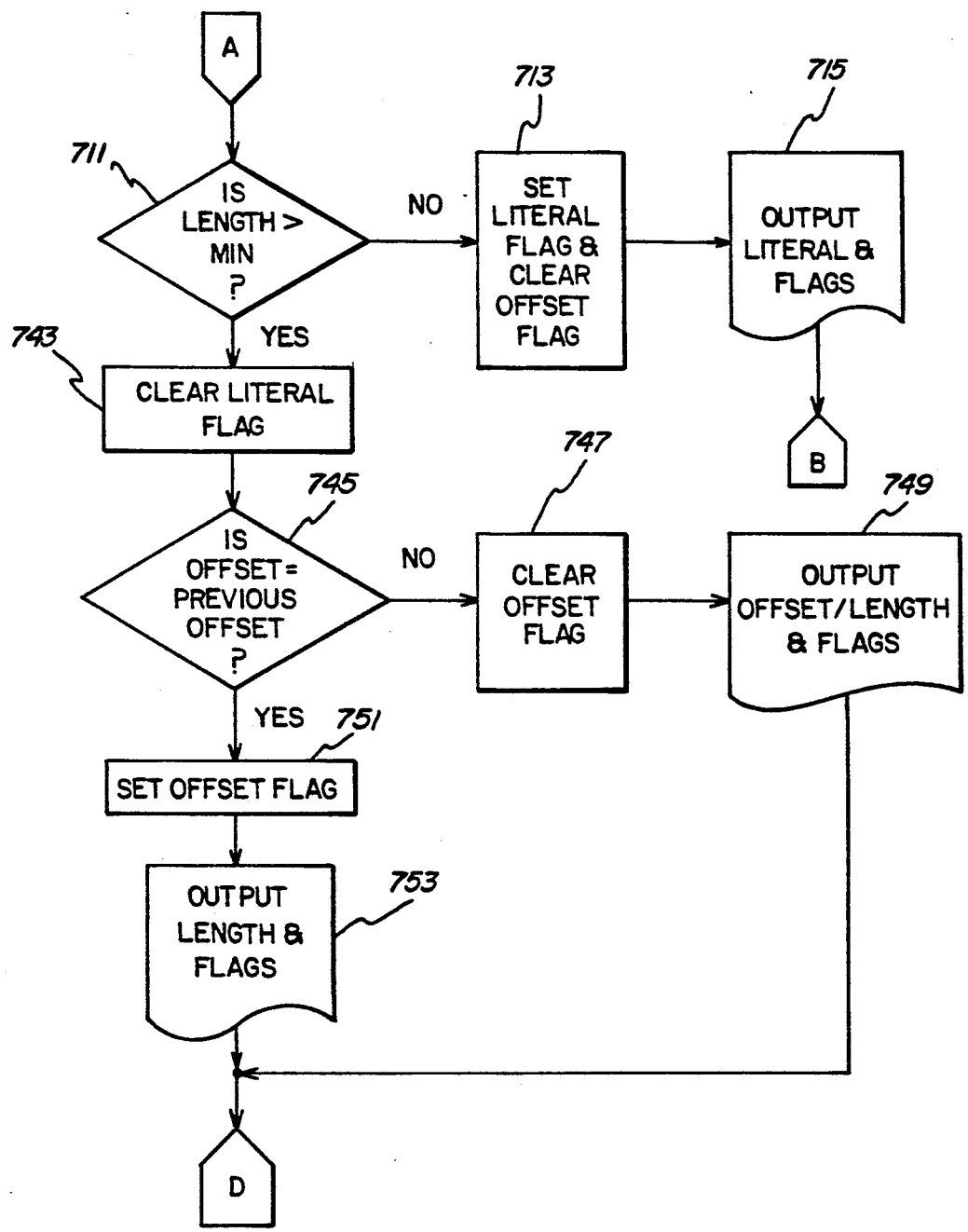

DATA COMPRESSION/DECOMPRESSION METHOD AND APPARATUS

BACKGROUND OF THE INVENTION

1. Field of the Invention

The present invention relates generally to data processing and more particularly to digital data compression. Description of Prior Art Information processing systems and data transmission systems frequently need to store large amounts of digital data in a mass memory device or to transfer large amounts of digital data using a resource which may only carry a limited amount of data at a time, such as a communications channel. Therefore, approaches have been developed to increase the amount of data that can be stored in memory and to increase the information carrying capacity of capacity limited resources. Most conventional approaches to realizing such increases are costly in terms of equipment or monetary expense, because they require the installation of additional resources or the physical improvement of existing resources. Data compression, in contrast with other conventional approaches, provides such increases without incurring large costs. In particular, it does not require the installation of additional resources or the physical improvement of existing resources.

Data compression methods and apparatuses remove redundancy from a data stream, while still preserving the information content. The data compression methods and apparatuses which are of the greatest interest are those which are fully reversible, such that an original data stream may be reconstructed from compressed data without any loss of information content. Techniques, such as filtering, which are not fully reversible, are sometimes suitable for compressing visual images or sound data. They are, nevertheless, not suitable for compression of program image files, textual report files and the like, because the information content of such files must be preserved exactly.

There are two major goals in digital data compression. The first goal is to maximize compression by using the fewest possible bits to represent a given quantity of input data. The second goal is to minimize the resources required to perform compression and decompression. The second goal encompasses such objectives as minimizing computation time and minimizing the amount of memory required to compress and decompress the data. Data compression methods of the prior art typically achieve only one of these goals.

There are two major families of data compression methods currently in use. Both of these families are derived from methods developed by Ziv and Lempel. The first family of methods is based on a method of Ziv which will be referred to hereinafter as LZ78. This method is described in detail in Ziv et al., "Compression of Individual Sequences Via Variable Rate Coding," *IEEE Transactions on Information Theory*, IT-24-5, Sep., 1978, pp 530–537. The second family of methods is based on another method of Ziv which will be referred to hereinafter as LZ77. This method is described in detail in Ziv et al., "A Universal Algorithm for Sequential Data Compression," *IEEE Transactions on Information Theory*, IT-23-3, May, 1977, pp 337–343.

For the purpose of conveniently manipulating digital data, the data is usually divided into symbols, such as binary words, bytes or ASCII characters. LZ78 and LZ77 compress an input data stream of symbols by dividing the input data into substrings of symbols, and then replacing the substrings with short codes representing those substrings. So that a compressed data stream may be decompressed, a dictionary equating each substring with a code which replaces it is built as substrings are replaced. The division of the input data stream into substrings is performed so that each substring is the longest string for which there is an identical substring in the input data stream.

LZ78-based methods build the dictionary from substrings for which matches have been found. The codes used in the output data to represent substrings of the input data are simply indexes into this dictionary. As noted above, substrings selected for placement in the dictionary are the longest substrings for which a matching substring may be found earlier in the input data. The most popular derivative of LZ78 is Lempel-Ziv-Welch, (hereinafter referred to as LZW) which is described in U.S. Pat. No. 4,558,302 issued to Welch on Dec. 10, 1985.

LZ78-based methods, including LZW, are very popular because of their high speed of compression. However, the primary disadvantage of LZ78-based methods is that they require large amounts of memory to hold the input data and the dictionary. Solutions to these problems with LZ78-based methods are suggested by Miller, U.S. Pat. No. 4,814,740 and Clark et al., International Patent Application PCT/GB89/00752. These references concern methods for limiting the complexity of the tree structures which are often used to find the longest matching substrings in the input data.

In contrast with building an independent dictionary on the basis of matches found, LZ77-based methods use the previously compressed input data as the dictionary. Therefore, a buffer memory is reserved for retaining some portion of the previously compressed data which will be used as the dictionary. In these methods, the codes which replace the substrings are pointers to matching substrings held in the buffer. As in LZ78-based methods, the replacement codes represent the longest available previous occurrence of a matching substring. The contents of the buffer memory determine availability in this context.

The pointers which replace substrings of the input data each comprise an ordered pair of values representing an offset and a length. The offset indicates the number of symbols between the substring replaced by the pointer and the substring to which the pointer points, while the length indicates the number of symbols in the substring replaced by the pointer.

Since any embodiment of an LZ77-based method must have a finite amount of memory, the range of values representable by the offset and length is limited. Thus, LZ77-based methods differ from each other in two parameters, N, the maximum offset distance a pointer may represent, and F, the maximum length of a substring that may be replaced by a pointer. The parameter N defines a window of available input data which is used as the dictionary. In particular, the dictionary contains only the input data which is within the maximum offset N of the substring currently being compressed or decompressed. The contents of the dictionary are continuously replenished from the input data as data is manipulated.

A derivative of the LZ77 algorithm was suggested by Storer and Szymanski. Their observation was that a pointer is sometimes longer than the substring it replaces. Thus, their suqqestion, hereinafter denoted as LZSS, was to use literal symbols taken directly from the input stream whenever a pointer would take up more space than the substring it replaces. A flag bit is then added to each pointer and symbol to distinguish pointers and symbols each from the other.

LZSS-based methods provide excellent data compression, qenerally better than LZW, but also require siqnificant computation time. This is caused by the well known, maximal matching substring problem, which is at the heart of LZ77-based compressors. In the context of LZ77-based data compressors, this problem calls for finding the longest substring in the dictionary, which matches the input data stream.

There have been many attempts to solve this problem, including for example, that of Brent as taught in "A Linear Algorithm for Data Compression," *The Australian Computer Journal*, Volume 19, Number 2, May 1987. However, the solution of Brent fails to achieve the best possible results of fast compression with a high compression ratio. Brent uses a hashing technique to quickly locate potential matches in the history buffer. However, Brent's method operates by hashing most of the substrings of the dictionary, in order to find the maximal matching substring all of the time. This is both time-consuming and memory intensive, as the hash table must be capable of pointing anywhere in the history buffer.

Furthermore, practical embodiments of Brent's method use a history buffer having a finite size. In such an embodiment, Brent's method will not always find the most recent, maximal match.

Thus, a general object of the present invention is to provide a method and apparatus for data compression that yields excellent compression for a variety of input data types including executable run files, report files, and document files while using a minimum of computation time.

Another object of the present invention is to provide a method and apparatus for data compression that uses a minimal amount of memory.

Yet another object of the present invention is to provide a method and apparatus for data compression that achieves the compression by means of an efficient solution to the maximal matching substring problem.

SUMMARY OF THE INVENTION

In order to achieve the above and other objects, the data system for compressing digital input data according to the present invention operates on input data which is divisible into symbols. Those symbols may then be grouped together into sequences of symbols, which may alternatively be referred to as substrings.

The system of the present invention uses an approach based on locality and probability to solve the maximal matching substring problem of LZ77-based compressors most of the time rather than attempting to solve it all of the time. The approach is based on the observation that the maximal matching substring for an input substring is frequently a substring which is nearby in the data stream. Thus, in most instances, the longest substring which matches an input substring will be found by looking only at the most recent potential matches. In those instances when the maximal matching substring problem is not solved, a near-maximal matching substring will often have been found, at a considerable saving of time, while forfeiting only a fraction of the compression which would be gained by finding the maximal matching substring.

In apparatuses according to the present invention, at least a portion of an input data stream is received into a memory. The present invention uses a portion of the memory as a history buffer containing a dictionary of recently compressed input data. It also maintains a lookahead buffer in the memory for holding a limited portion of input data to be processed next. Compressed output data is provided in the form of a mixture of literal symbols and pointers to locations in the history buffer which contain sequences of symbols matching a portion of the sequence of symbols in the lookahead buffer, referred to as an input substring.

The present invention maintains a hash table. Short, prefix substrings of the substring in the lookahead buffer are hashed to obtain an index into the hash table. Entries in the hash table of the present invention comprise lists of pointers to locations in the history buffer containing potential matches. The lists of pointers are first-in-first-out (FIFO) collision chains of hash collisions, where a hash collision is said to occur whenever two or more prefix substrings yield the same hash value. In the present invention, all collision chains have identical numbers of pointers. The input substring is a first sequence input to a sequence comparing facility. Each sequence identified in the history buffer through use of the hash table is a second sequence input to a sequence comparing facility. The sequence comparing facility identifies a longest matching sequence from among the potential matches identified in the history buffer by the hash table. A facility for generating compressed output data operates in response to the sequence comparing facility, to provide output data as indicated above.

The approach of the present invention combines principles of locality and probability in maintaining the hash table such that each FIFO collision chain holds only a limited number of pointers to locations within a history buffer; between 1 and 8 pointers, for example. Thus, the first prefix substring in the lookahead buffer may be hashed, providing an index into the hash table, and thereby obtaining fast access to a limited number of recent, potentially-matching locations in the history buffer. Therefore, despite not finding the maximal matching substring all of the time, the present invention produces compression results that are similar to methods that solve the matching problem all of the time, but in significantly less time.

A decompressor according to the present invention simply provides the literal symbols and expansions of the pointers as decompressed data. Pointers representing data compressed in accordance with the present invention point to sequences which will have been decompressed before expansion of the pointer. Expansion of a pointer includes providing as decompressed data a copy of the previously decompressed sequence to which it points in lieu of the pointer.

The invention will be more fully understood from the following description, when read in conjunction with the accompanying drawing, in which like numerals identify like elements.

BRIEF DESCRIPTION OF THE DRAWING

FIGS. 7A, 7B, and 7C are a flow chart of a compression method according to the present invention.

DETAILED DESCRIPTION

Figure 1:
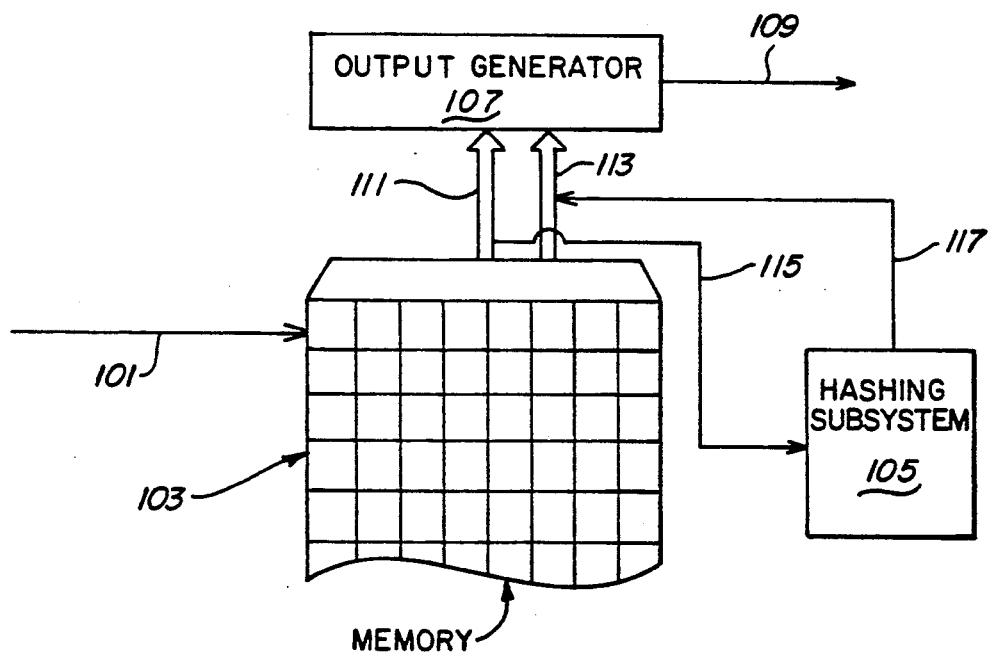
FIG. 1 is a block diagram of a system compressing data according to the present invention.

A preferred embodiment of the present invention is initially described with reference to FIG. 1. An input data stream 101 comprising symbols, such as ASCII characters, which are each a fixed number of bits is received into a memory 103. In the preferred embodiment, memory 103 is a random access memory (RAM) of a general-purpose, data processing system. Input data stream 101 is processed by output generator 107 to produce a compressed output data stream 109. The input data stream 101, however, remains unchanged in memory 103 throughout processing. Hashing subsystem 105 facilitates processing as described in greater detail with reference to FIG. 5, below. Processing of the input data stream 101 will be more readily understood in view of the arrangement of input data stream 101 in memory 103 which is now discussed in more detail.

Figure 2:
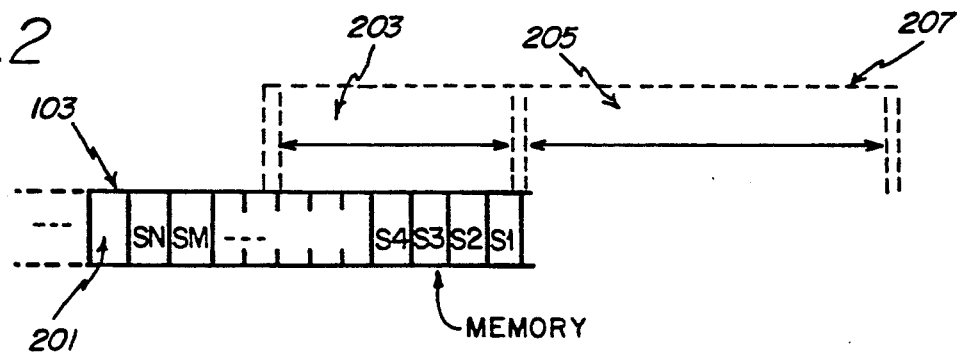
FIG. 2 is a memory map illustrating the contents of memory at a time when input data has been received, but processing had not yet begun.
Figure 3:
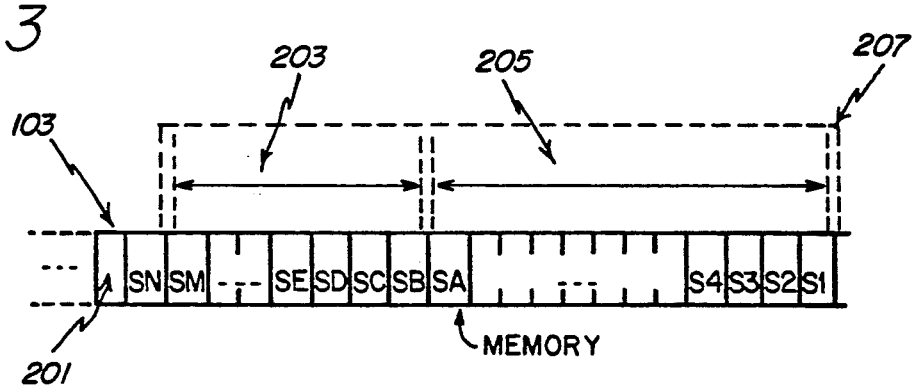
FIG. 3 is a memory map illustrating the contents of the memory of FIG. 2 after symbols S1 through SA have been processed.
Figure 4:
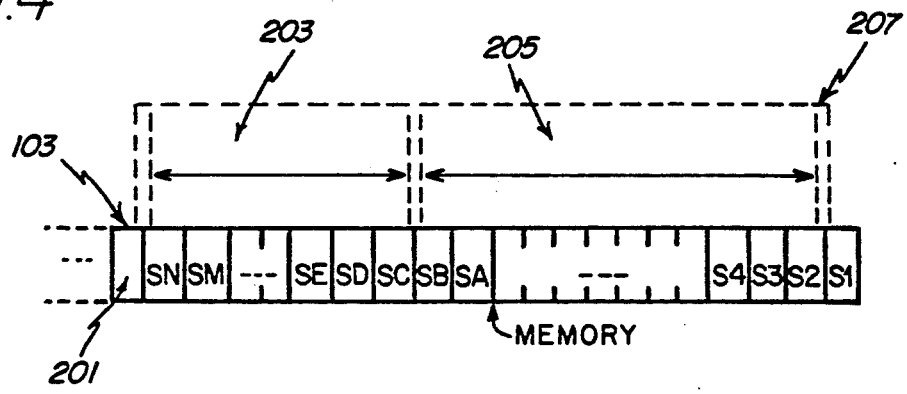
FIG. 4 is a memory map illustrating the contents of the memory of FIG. 3 after an additional symbol SB has been processed.

Data in the input data stream 101 is serially stored in memory 103 as a linear sequence of symbols in consecutive memory locations as illustrated in FIGS. 2, 3 and 4. In these figures, each box (e.q. box 201) represents a memory location for storing a symbol. The stored symbols are denoted by the reference characters S1, S2, S3, S4, SA, SB, SC, SD, SE, SM, and SN. Sequences of symbols occupying adjacent memory locations constitute substrings of symbols. For example, the sequence of symbols (SA, SB, SC, SD) form a substring.

FIG. 2, illustrates the state of the memory 103 when input data stream 101 (FIG. 1) has been stored in the memory 103 (FIG. 2) as a linear sequence of symbols in consecutive memory locations, but no data in the input data stream has yet been compressed. The memory 103 includes a lookahead buffer 203 which is a portion of memory 103 wherefrom lookahead substring 111 is obtained. For example, in FIG. 3 the substring in lookahead buffer 203 consisting of symbols SB through SM, form lookahead substring 111 (FIG. 1). As processing progresses, symbols beginning with S1 are compressed and moved out of lookahead buffer 203 into a second region of memory known as a history buffer 205. The symbols in history buffer 205 are those from which history substring 113 (FIG. 1) are drawn. The role of such lookahead substrings 111 and history substrings 113 in processing of input data will be more apparent in the discussion below. The state of memory 103 after symbols S1 through SA have been compressed is illustrated in FIG. 3. Since all substrings used by the data compressor of the present invention are obtained from lookahead buffer 203 or history buffer 205, these buffers when taken together form a processing window 207.

The symbols in the lookahead buffer ar processed sequentially beginning with those symbols in the right-most positions in the lookahead buffer 203. Thus, symbol SB would be the first symbol processed in FIG. 3. When the symbol SB of FIG. 3 is processed, the resultant state of memory is as illustrated in FIG. 4. Symbol SN, which was stored in FIG. 3 just outside of lookahead buffer 203, is moved inside lookahead buffer 203 in FIG. 4, while the oldest symbol S1 in history buffer 205, is outside of processing window 207. The movement of symbols in and out of the buffers 205 and 207 need not be accomplished by physically moving symbols among different memory locations in memory 103; rather, it may be accomplished, as in the preferred embodiment, by sliding the logical construct of the processing window 207 through memory locations in memory 103.

Resuming the description of FIG. 1, during processing, output sequence generator 107 receives lookahead substring 111 and history substring 113 from the respective buffers 203 and 205. Output sequence generator 107 compares lookahead substrings 111 and history substrings 113 to find matching substrings which may be compressed by removing redundant data.

In the preferred embodiment, memory 103, hashing subsystem 105 and output generator 107 are a combination of generalized hardware comprising the general purpose, data processing system and a software program running in the general-purpose, data processing system. However, as will be evident to those skilled in the art, these elements may be equally well realized in alternative embodiments, such as special purpose hardware. For the purpose of further discussion, the operation of the system of FIG. 1 will be considered in two parts: operation of hashing subsystem 105 in connection with memory 103 and operation of output generator 107.

Figure 5:
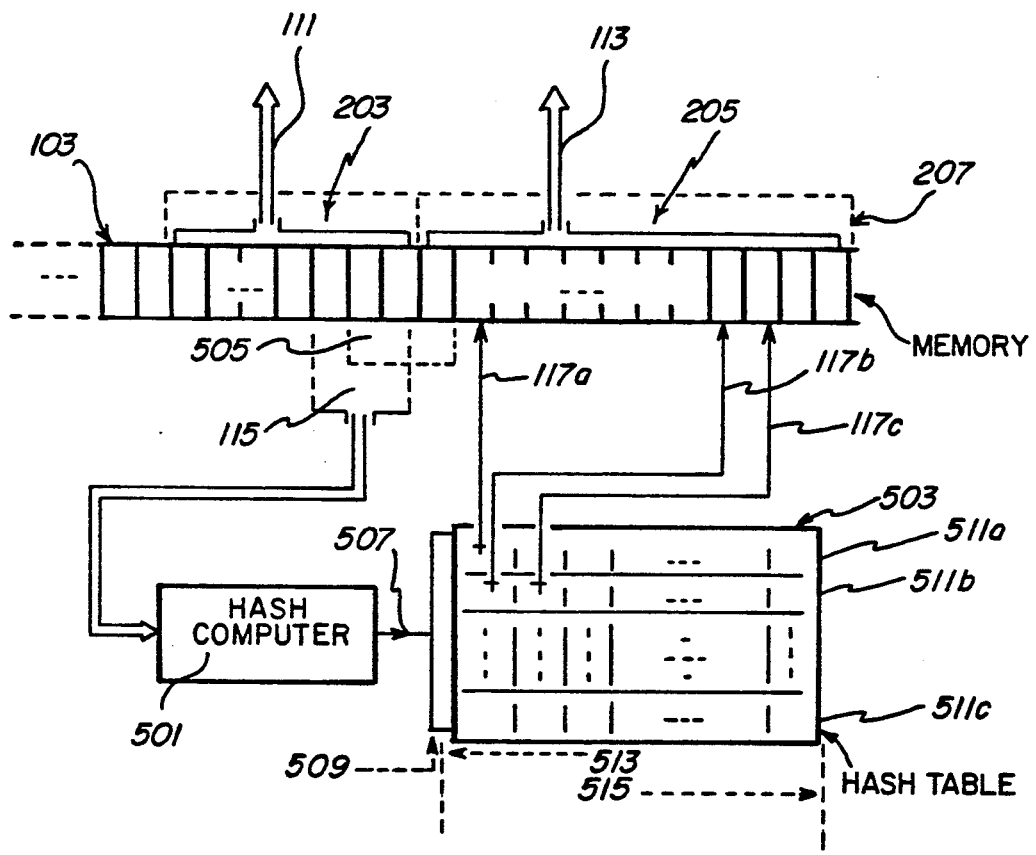
FIG. 5 is a detailed block diagram of a hashing subsystem in a preferred embodiment of the resent invention.

The structure and function of hashing subsystem 105 in connection with memory 103 is described with reference to FIG. 5. According to the present invention, hash computer 501 operates on prefix substrings having a fixed, uniform length, less than the length of lookahead substring 111. In the preferred embodiment, a prefix substring 115 comprising the first three symbols of lookahead substring 111 is forwarded to a hash computer 501 from the lookahead buffer 203. Hash value 507 is used as an index 509 into hash table 503, for selecting a pointer 117 to history substring 113. Pointer 117 may be one of pointers 117a, 117b, or 117c, for example. Thus, history substring 113 is a substring 113 selected from those substrings to which pointers 117 point. Now, the operation of hashing subsystem 105 is described in greater detail.

The hash computer 501 performs a hashing function on prefix substring 115. Hashing functions are well known in the art. In this preferred embodiment, the hashing function performs a bit wise, logical exclusive or (XOR) of the symbols comprising the prefix substring 115. A bit-wise XOR performs the logical function XOR on corresponding bits of two input bit streams. Logical XOR is a function of two input bits which returns an asserted value if only one of the two input bits is asserted, but returns a deasserted value otherwise. This function is chosen for the preferred embodiment because it may be computed rapidly and results in a modest hash table size. Nevertheless, those skilled in the art will recognize that other selection criteria are possible, as are other suitable hashing functions. Prefix substring 115 is derived from an immediately preceding prefix substring 505. In particular, it is derived by dropping a first symbol of preceding prefix substring 505 and adding on a new last symbol.

Thus, the hashing function may be performed as follows:

(1) obtain a hash value computed earlier for previous prefix substring 505;

(2) bit wise XOR the previous hash value with the dropped first symbol;

(3) bit wise XOR the result of operation (2) with the new last symbol.

The result is the desired hash value 507 of prefix substring 115. Hash value 507 is used to locate a matching hash table index 509 for selecting one of the entries of hash table 503.

Hashing functions map an input, such as prefix substring 115, into a more limited number of hash values 507. Thus, for some different choices of prefix substring 115, the same hash value 507 may be obtained. Furthermore, since very short prefix substrings 115 are used in the preferred embodiment, multiple, identical prefix substrings 115 may exist within history buffer 205. Multiple inputs mapping into a single hash value create hash "collisions." In order to cope with these "collisions," hash table 503 has the structure of a two dimensional array. By including a second dimension in the hash table 503 of the present invention, lists of "collisions" may be stored.

Since pointers 117 may express only a finite range of locations in memory 103, it is desirable to hold only the most recent pointers 117 in each entry. Thus each entry, or row of the array, is a first-in, first-out (FIFO) collision chain, such as 511a, 511b and 511c for example. FIFO collision chains 511 consist of a fixed, uniform number of pointers 117. Since collision chains 511 are organized in a FIFO manner, newer entries are to be found at the trailing end 513 of the chains while older entries are found at the leading end 515 of the chains.

Although hash table 503 has an array structure in the preferred embodiment, the array structure of the data of hash table 503 is given by way of illustration only. Hash table 503 and collision chains 511 may assume other structures, as will be evident to those skilled in the art. For example, hash table 503 may be a one dimensional array of pointers to linked lists of FIFO collision chains 511.

Thus, in response to the input of a prefix substring 115, hash computer 501 and hash table 503 cooperate to produce a collision chain 511 having a fixed number of pointers 117. Each pointer 117 in the selected collision chain 511 is provided with a history substring 113. As described in connection with FIG. 1, lookahead substring 111 and each of the history substrings 113 are forwarded to output generator 107.

Figure 6:
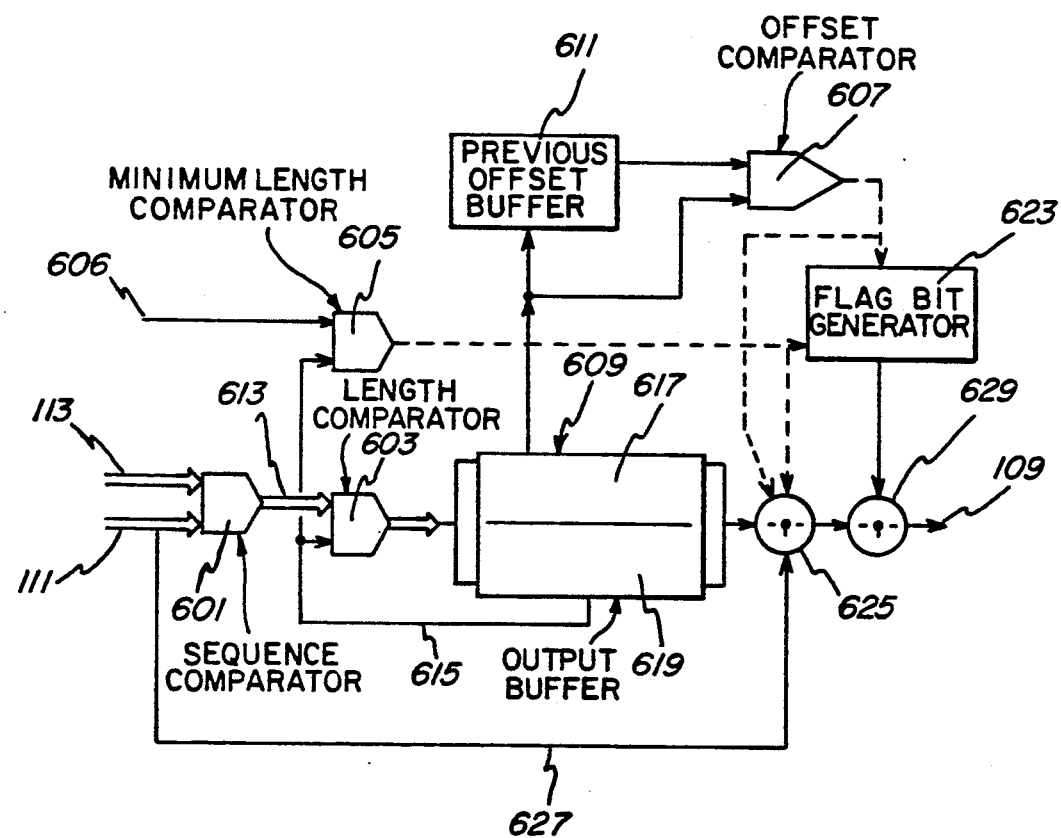
FIG. 6 is a detailed block diagram of an output sequence qeneration in a preferred embodiment of the present invention.

Output generator 107 is now described with reference to FIG. 6. Lookahead substring 111 and history substrings 113, as described in connection with FIG. 5, are received by sequence comparator 601. Sequence comparator 601 determines the number of sequential symbols in each history substring 113 which match corresponding symbols in lookahead substring 111, and beginning with the symbols corresponding to prefix substring 115. The number of symbols in history substring 113 which match corresponding symbols in lookahead substring 111 is defined to be the length 613 of history substring 113. Thus, sequence comparator 601 determines a length 613 of history substring 113. Length comparator 603 receives length 613 as one input. A second input to length comparator 603 denotes the longest match found thus far 615. This second length value 615 is a value that has been previously stored by length comparator 603 in output buffer 609. When length 613 exceeds the length 615, length comparator 603 stores a new offset 617 and length 619 in output buffer 609. The offset 617 and length 619 point to a location in memory 103 wherein history substring 113 begins.

Figure 7A:
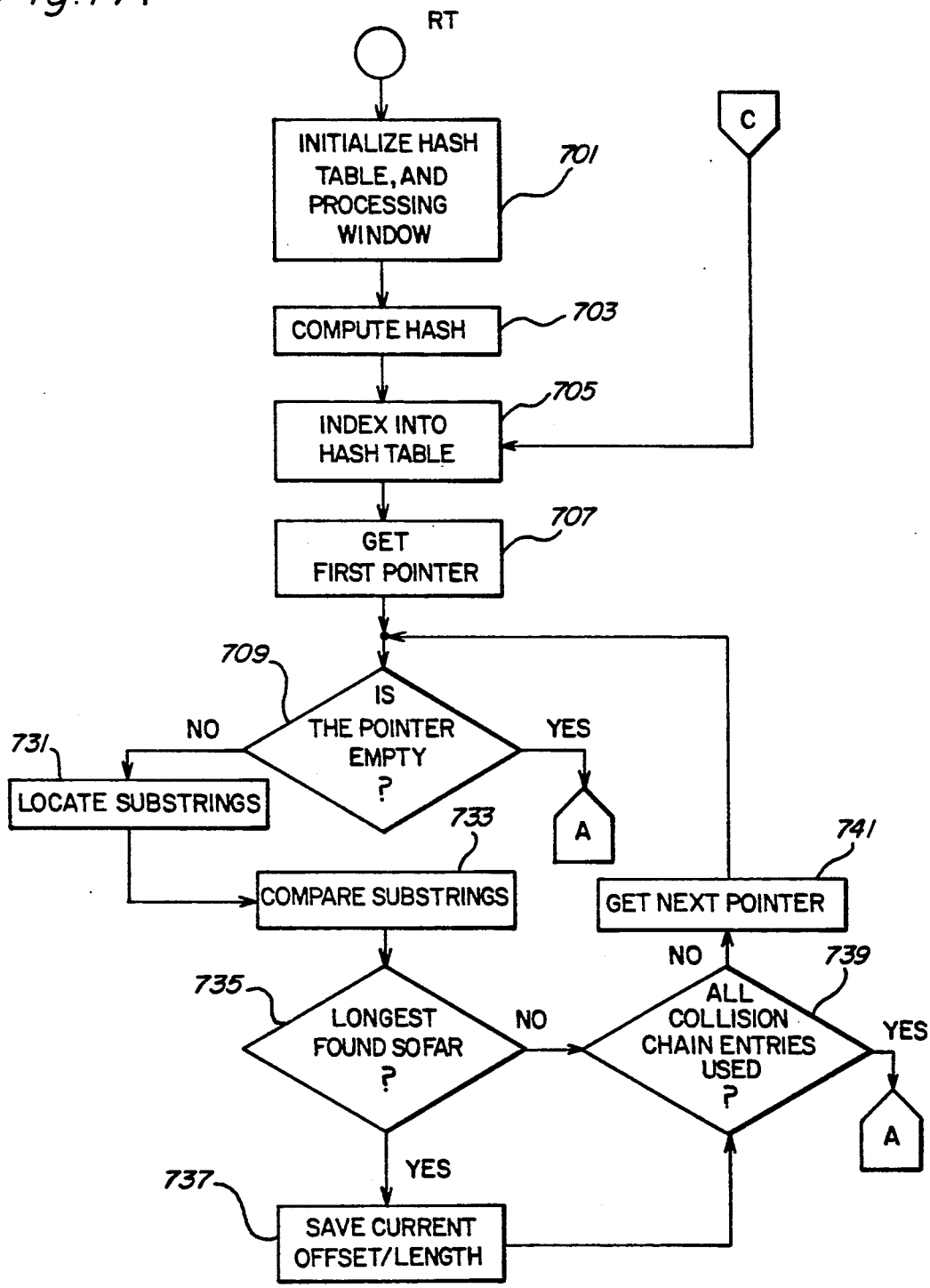

The operations heretofore outlined are repeated for all history substrings 113 which were provided along with the lookahead substring 111 as is further described below in connection with the flow charts of FIGS. 7A, 7B and 7C. Thus, when all history substrings 113 have been processed by output generator 107, output buffer 609 contains a pointer comprising an offset 617 and a length 619 denoting the longest history substring 113 found to match lookahead substring 111.

Minimum length comparator 605 and offset comparator 607 perform two additional tests on the contents of output buffer 609. The results of these tests determine output data stream 109. In the first test, minimum length comparator 605 compares the length 619 stored in output buffer 609 with minimum length 606. Minimum length 606 is a constant which is selected to ensure that a pointer consisting of offset 617 and length 619 is not output when length 619 denotes fewer bits than the number of bits occupied by the pointer. Minimum length comparator 605 controls flag bit generator 623 and output gate 625. Output gate 625 may selectively output the pointer in output buffer 609, the length 619 or the first literal symbol 627 of lookahead substring 111. Further, if output gate 625 outputs the pointer contained in output buffer 609, the offset 617 of that pointer is also transferred to previous offset buffer 611.

In the second test, prior to selecting the pointer contained in output buffer 609 for output, offset comparator 607 compares the contents of previous offset buffer 611 with the offset 617 currently in output buffer 609. The result of the comparison performed by offset comparator 607 is used to exert further control over flag bit generator 623 and output gate 625.

Finally, flag bits output by flag bit generator 623 are appended to the output of output gate 625 by gate 629, producing a compressed output data stream 109.

Further description of the operation of these elements for data compression according to the present invention is given herein below in connection with the flowcharts of FIGS. 7A, 7B and 7C. The steps of the method will be better understood when viewed along with the other FIGS. as well.

Processing is begun after receiving input data stream 101 into memory 103. First, hash table 503 is initialized to an empty condition in step 701. Memory 103 and processing window 207 are placed in a condition as shown in FIG. 2. Next in step 703, a hash value is computed for a first prefix substring. These two steps 701 and 703 complete initialization of the preferred method, however, other methods may use other initialization techniques, as will be readily apparent to those skilled in the art.

Alternate embodiments are contemplated, wherein the hash table 503 (FIG. 5) is not initialized. For example, one embodiment flushes history buffer 205 whenever history buffer 205 becomes full. However, hash table 503 requires no additional special attention. In such an embodiment, pointers 117 which point to unused locations in history buffer 205 are detected in an alternate step 709 (FIG. 7A), which performs the test "Is the location pointed to unused?" instead of the test indicated. Thus, if the result of the test is "Yes" then any history substring 113 obtained therefrom may be ignored. However, if the result of the test is "No" then a history substring 113 is obtained from the pointer 117 which points to a used location in history buffer 205, and processing occurs as described herein below in connection with the preferred embodiment.

Compression proceeds iteratively, beginning by indexing 705 into hash table 503. Indexing step 705 causes retrieval of a collision chain 511 from hash table 503. From that collision chain 511 a first pointer 117 is obtained 707. Since hash table 503 is presently empty, the test in step 709 for an empty pointer gives the result "Yes." Thus, processing proceeds to step 711 in FIG. 7B, which tests if length 619 is greater than minimum length 607. Since there is no previous data which has been operated upon, this test returns the value "No." Next, step 713 sets a flag bit to indicate that a literal symbol will be output, and clears a flag bit for indicating an offset alone will be output. Literal symbol 627 and the flag bits generated are then output in step 715. Thus, the first symbol S1 is processed, and the processing window 207 must be updated for future processing.

Figure 7C:
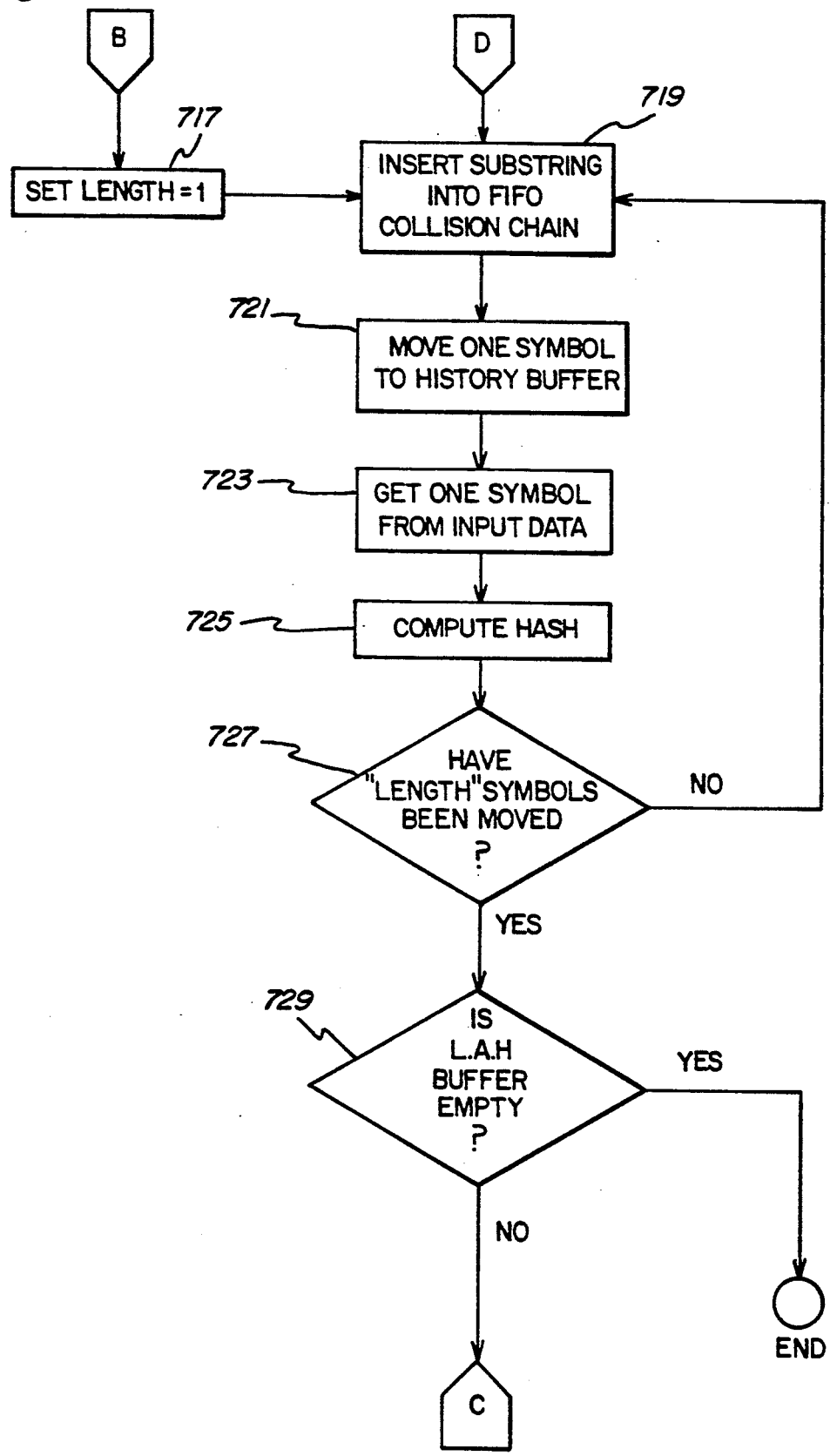

Subsequently, as shown in FIG. 7C the length of the substring output is set to one symbol in step 717. A pointer to the substring beginning with the symbol just processed is inserted in step 719 into the FIFO collision chain 511 which was obtained in step 705. One symbol is moved from the lookahead buffer to the history buffer 721, and one symbol is inserted in the lookahead buffer from the input data 723 These steps together comprise the movement of processing window 207 illustrated in FIGS. 3 and 4. Finally, a hash value is computed 725 for the prefix substring 115 of the resulting contents of the lookahead buffer 203. A test is performed to determine if all symbols processed have been moved to the history buffer (step 727), followed by another test which determines if all of input data stream 101 has been processed (step 729). All processed symbols having been moved, and lookahead buffer 203 not being empty, processing continues at step 705 in FIG. 7A.

When indexing step 705 obtains a collision chain 511 which has several pointers in it, the test performed in step 709 yields the answer, "No." Thus, in step 731 a substring is located which is pointed to in history buffer 205. This substring is a history substring 113, which is compared with lookahead substring 111 in step 733. In step 735, the result of the comparison of step 733 is checked to determine if the current history substring 113 is the longest such substring found so far. If it is, a pointer to history substring 113 is saved 737 in output buffer 609. Otherwise, a test is performed to determine if all entries of collision chain 511 have been checked (step 739). If not, a next pointer 117 is obtained (step 741). Processing proceeds in this loop until either the next pointer 117 is empty, causing step 709 to give a "Yes" result, or all entries of a full collision chain 511 have been used and step 739 yields a "Yes" result. When a "Yes" result is obtained, the processing is transferred to the test 711 in FIG. 7B, which begins output processing.

One branch of output processing has been discussed in connection with processing the first symbol of input data stream 101. Now, the other two branches of output processing will be described. If length 619 exceeds the minimum length 607 the flag bit indicating a literal symbol is output is cleared (step 743). If length 617 is not equal to previous length 611, then the test of step 745 passes control to step 747 which clears the flag bit for indicating an offset only is output. In step 749 offset 617 and length 619 are placed, along with the flag bit, in output data stream 109. If test 745 determines that the present offset 619 is equal of the previous offset 611, then step 751 sets a flag bit for indicating that only a length value and the flag bits are to be output. Finally, the length and flags are output at step 753. Both of these output branches transfer control to step 719 in FIG. 7C, which has already been discussed.

Figure 8:
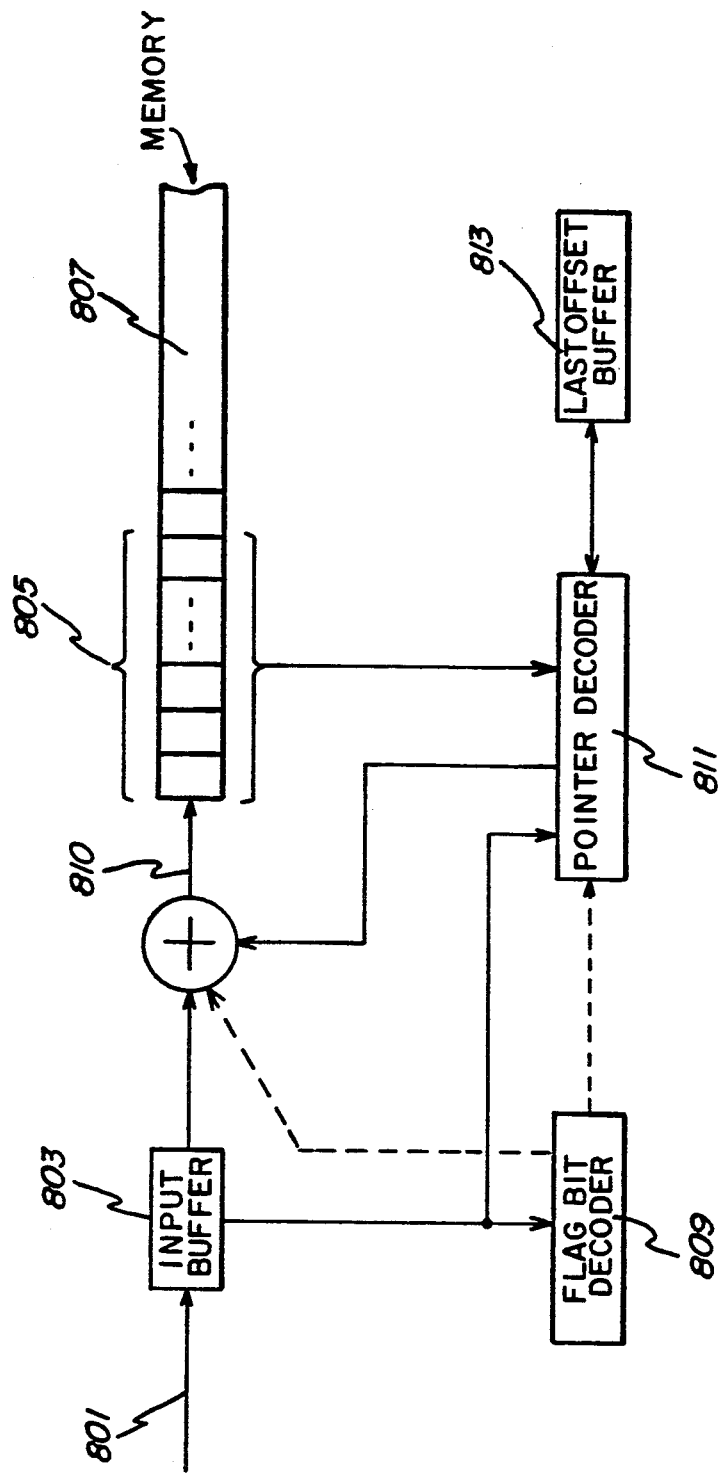
FIG. 8 is a block diagram of a decompressor according to the present invention.
Figure 9:
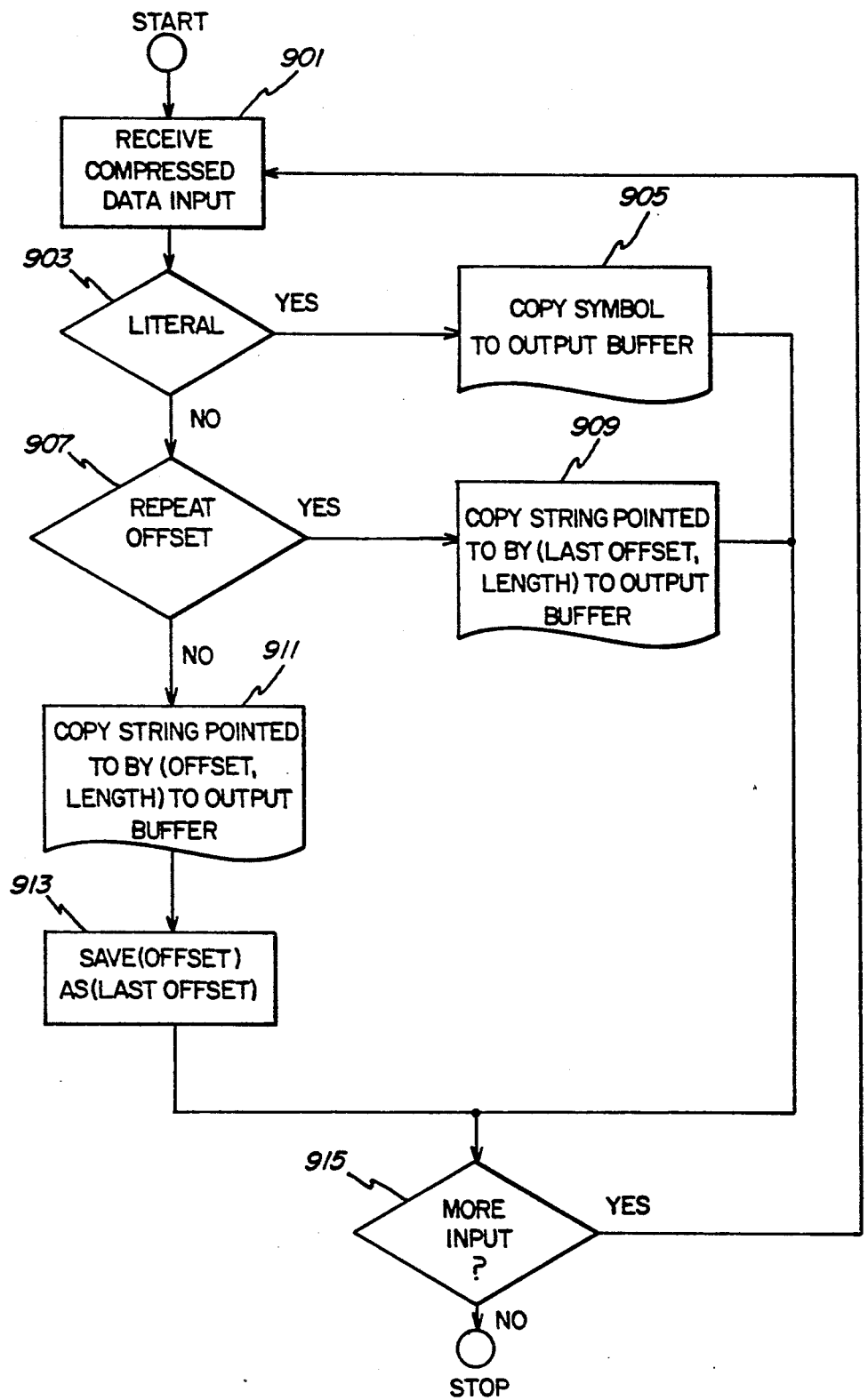
FIG. 9 is a flow chart of a decompression method for use with the apparatus of FIG. 8.

A preferred method and apparatus for decompressing data compressed by the method of the present invention is now described with reference to FIGS. 8 and 9. When compressed data 801 is received (step 901, FIG. 9) by the input buffer 803 of the decompressor of this preferred embodiment, it is expanded back to the original form of the input data by the following method, without losing or altering any of the information therein. The decompressor maintains an output buffer 805 in memory 807 containing recent, decompressed data. The flag bit decoder 809 simply checks the flag bit which differentiates literal symbols from pointers 903 (step 903, FIG. 9). If a literal symbol is indicated, it is provided as output (step 905, FIG. 9) in the output data stream 810. If a pointer is indicated (step 903, FIG. 9), the flag bit decoder 809 checks the flag bit which identifies repeated offset values (step 907, FIG. 9). If a repeated offset is indicated, the immediately previous offset and the length contained in the current pointer are used by the pointer decoder 811 to locate and copy (step 909, FIG. 9) a sequence of recently decompressed symbols within the buffer 805 in memory 807 to the output data stream 810. Otherwise, the offset and length contained in the current pointer are used to locate and copy (step 911, FIG. 9) a sequence within the buffer 805 in memory 807 to the output data stream 810. The last offset used is retained (step 913, FIG. 9) in last offset buffer 813 for possible use in a future repeat offset step 909. This process continues until all compressed data has been decompressed as determined at step 915, FIG. 9.

As a practical matter, in this preferred embodiment, the buffer containing the recently decompressed data need be no larger than the size of the history buffer in the compressor. Since the pointer is incapable of indicating the location of a sequence further away, no recently decompressed data beyond that need be retained.

Various extensions and variations contemplated by this invention will now be apparent to those skilled in the art. These may include extensions for use of this method in modems, mass storage devices, and other applications. Choices of parameters such as the sizes of the lookahead or history buffers, or the number of entries in the collision chains to optimize performance in a particular application will be readily apparent to those skilled in the art.

What I claim is:

1. A system for compressing digital input data, said input data being divisible into symbols, comprising:
  a memory for holding at least first and second sequences of symbols from said input data, said first sequence having a prefix substring including fewer symbols than said first sequence;

means for receiving said first and second sequences of symbols from said memory and comparing said first and second sequences;

means for receiving said prefix substring from said memory and computing a hash value therefrom;

a hash table for receiving said hash value and providing a pointer to said second sequence of symbols, said hash table including a plurality of first in, first-out (FIFO) collision chains, having identical numbers of pointers to locations in said memory; and means for generating compressed output data responsive to said means for receiving said first and second sequences of symbols from said memory.

2. A system as claimed in claim 1, wherein said memory further comprises:
a first buffer for holding said first sequence; and
a second buffer for holding at least one said second sequence.

3. A system as claimed in claim 1, wherein said compressed output data includes an information portion selected from a group consisting of a pointer to one said second sequence, a partial pointer to one said second sequence, and a first symbol of said first sequence; and a flag portion for identifying which member of said group is selected; and said means for generating compressed output data further comprises:
means for generating said information portion; and
means for generating said flag portion.

4. A system as claimed in claim 3, wherein said pointer comprises:
an offset for identifying a first symbol of said second sequence; and
a length over which said first sequence and said second sequence match.

5. A system as claimed in claim 3, wherein said partial pointer comprises:
a length over which said first sequence and said second sequence match; and
without including an offset for identifying a first symbol of said second sequence.

6. A system for processing digital input data, said input data being divisible into sequences of bits representing symbols, comprising:
a memory for holding at least first and second sequences of symbols from said input data, said first sequence having a prefix substring of symbols of a fixed length;
means for receiving said first and second sequences of symbols from said memory and determining a length over which said first and second sequences match;
means for receiving said prefix substring and computing a hash value therefrom;
a hash table for receiving said hash value and providing a pointer to said second sequence of symbol signals, said hash table including a plurality of first in, first-out (FIFO) collision chains, having identical numbers of pointers to locations in said memory;
means for generating compressed data responsive to said means for receiving said first and second sequences of symbols from said memory;
means for receiving said compressed data;

means for decompressing said compressed data received.

7. A system as claimed in claim 6, wherein said compressed data includes an information portion selected from a group consisting of a pointer to one said second sequence, a partial pointer to one said second sequence, and a first symbol of said first sequence; and a flag portion for identifying which member of said group is selected; and said means for generating compressed data further comprises:
means for generating said information portion; and
means for generating said flag portion.

8. A system as claimed in claim 7, wherein said means for decompressing said compressed data further comprises:
means for decoding said flag portion; and
means responsive to said means for decoding said flag portion, for expanding said information portion into a decompressed data sequence identical to said input data.

9. A system as claimed in claim 8, wherein said means for expanding said information portion further comprises:
a memory for receiving sequences of decompressed data; and
means for identifying in said memory for receiving decompressed data sequences pointed to by said pointers and said partial pointers; and
means for copying said sequences identified by said means for identifying to new locations in said memory after a most recently decompressed symbol.

10. A system as claimed in claim 6, wherein said means for generating compressed data further comprises:
means for transmitting said compressed data to a remote location.

11. A system as claimed in claim 10, wherein said means for receiving said compressed data is disposed at said remote location.

12. A method for processing digital input data, said input data being divisible into symbols, comprising the steps of:
receiving input data, including a first sequence of symbols having a prefix substring including fewer symbols than said first sequence;
computing a hash value of said prefix substring;
obtaining a pointer to a second sequence of symbols in said input data, from a hash table including a plurality of first in, first-out collision chains, having identical numbers of pointers to sequences of symbols;
comparing said first and second sequences; and
generating compressed data output based on said comparison of said first and second sequences.

13. A method as claimed in claim 12, wherein the step of generating further comprises the steps of:
outputting information data selected from a group consisting of a pointer to one said second sequence, a partial pointer to one said second sequence, and a first symbol of said first sequence; and
outputting flag data for identifying which member of said group is selected.

14. A method as claimed in claim 12, further comprising the step of:
decompressing said compressed data.

* * * * *